United States Patent
Zomorodi Moghadam et al.

(10) Patent No.: US 11,705,591 B2
(45) Date of Patent: Jul. 18, 2023

(54) TRACTION BATTERY PACK THERMAL EVENT DETECTION

(71) Applicant: Ford Global Technologies, LLC, Dearborn, MI (US)

(72) Inventors: Hesam Zomorodi Moghadam, Ypsilanti, MI (US); Navid Rahbariasr, Inkster, MI (US); Xu Wang, Northville, MI (US); Graham Lynn Briggs, Detroit, MI (US); Jeffery R. Grimes, Canton, MI (US); Michael George Schamber, Milford, MI (US); Wai Hwa Fong, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 282 days.

(21) Appl. No.: 17/015,407

(22) Filed: Sep. 9, 2020

(65) Prior Publication Data

US 2022/0077517 A1 Mar. 10, 2022

(51) Int. Cl.
*H01M 10/48* (2006.01)
*H01M 10/42* (2006.01)
*B60L 3/00* (2019.01)
*G01R 31/3835* (2019.01)
*B60L 58/25* (2019.01)

(52) U.S. Cl.
CPC ......... *H01M 10/486* (2013.01); *B60L 3/0046* (2013.01); *B60L 58/25* (2019.02); *G01R 31/3835* (2019.01); *H01M 10/425* (2013.01); *B60L 2240/545* (2013.01); *B60L 2240/547* (2013.01); *B60L 2240/549* (2013.01); *H01M 2220/20* (2013.01)

(58) Field of Classification Search
None
See application file for complete search history.

(56) References Cited

U.S. PATENT DOCUMENTS

| | | |
|---|---|---|
| 9,046,580 B2 | 6/2015 | Hermann |
| 2017/0117532 A1 | 4/2017 | Frias et al. |
| 2019/0288354 A1 | 9/2019 | Uchida et al. |
| 2020/0353821 A1* | 11/2020 | Sato ................ B60L 58/25 |

FOREIGN PATENT DOCUMENTS

| | | | |
|---|---|---|---|
| CN | 103594743 | 2/2014 | |
| CN | 111406355 A * | 7/2020 | ............ B60L 53/62 |
| TW | 201334259 | 8/2013 | |

\* cited by examiner

*Primary Examiner* — Patrick Assouad
*Assistant Examiner* — Haidong Zhang
(74) *Attorney, Agent, or Firm* — David B. Kelley; Carlson, Gaskey & Olds, P.C.

(57) ABSTRACT

A method of detecting a thermal event associated with a battery assembly of an electrified vehicle includes, among other things, obtaining a temperature reading from a sensor associated with an area of the battery assembly, assessing whether the sensor is flagged with a first identifier or a second identifier. The first identifier indicates that the temperature reading is reliable. The second identifier indicates that the temperature reading is unreliable. If the sensor is flagged with the first identifier, the method detects a thermal event associated with the battery assembly based on the temperature reading from the sensor.

18 Claims, 3 Drawing Sheets

TRACTION BATTERY PACK THERMAL EVENT DETECTION

TECHNICAL FIELD

This disclosure relates generally to thermal event detection for battery packs of electrified vehicles.

BACKGROUND

Vehicles are being developed that reduce or eliminate reliance on internal combustion engines. Electrified vehicles are one type of vehicle being developed for this purpose. In general, electrified vehicles differ from conventional motor vehicles because they are selectively driven by battery powered electric machines. Conventional motor vehicles, by contrast, rely exclusively on an internal combustion engine to propel the vehicle. The battery cells and battery internal components of electrified vehicles can experience thermal events, such as thermal runaway.

SUMMARY

A method of detecting a thermal event associated with a battery assembly of an electrified vehicle according to an exemplary aspect of the present disclosure includes, among other things, obtaining a temperature reading from a sensor associated with an area of the battery assembly and assessing whether the sensor is flagged with a first identifier or a second identifier. The first identifier indicates that the temperature reading is reliable. The second identifier indicates that the temperature reading is unreliable. If the sensor is flagged with the first identifier, the method detects a thermal event associated with the battery assembly based on the temperature reading from the sensor.

Another example of the foregoing method includes detecting a thermal event associated with the battery assembly without relying on the temperature reading from the sensor.

In another example of any of the foregoing methods, the temperature reading is a current temperature reading. Also, the method includes flagging the sensor with the second identifier based on the current temperature reading during a current drive cycle, and based further on a past temperature reading from the sensor during a preceding drive cycle.

In another example of any of the foregoing methods, the preceding drive cycle immediately preceded the current drive cycle such that there was no intervening drive cycle between the preceding drive cycle and the current drive cycle.

In another example of any of the foregoing methods, the current temperature reading from the sensor is obtained at a start of the current drive cycle. The past temperature reading from the sensor is obtained at a start of the preceding drive cycle.

Another example of any of the foregoing methods includes, during the preceding drive cycle, flagging the sensor with the first identifier or a third identifier. The third identifier indicates that the sensor is potentially unreliable. Also, the method includes, during the current drive cycle, flagging the sensor with the second identifier based at least in part on the sensor being flagged with the third identifier during the previous drive cycle.

In another example of any of the foregoing methods, the sensor is flagged with the second identifier during the current drive cycle if the sensor was flagged with the third identifier during the preceding drive cycle, but not if the sensor was flagged with the first identifier during the preceding drive cycle.

In another example of any of the foregoing methods, the sensor is a thermistor.

Another example of any of the foregoing methods includes keeping a battery monitoring system awake for a set time based on at least one temperature reading from the sensor that are not flagged with the second identifier indicating that the information from the sensor is unreliable.

Another example of any of the foregoing methods includes initiating a thermal event alert in response to detecting a voltage drop associated with the battery assembly and detecting a temperature increase using the temperature reading from the sensor when the sensor is not flagged as unreliable.

Another example of any of the foregoing methods includes shutting down the battery monitoring system after expiration of the set time.

An electrified vehicle assembly according to another exemplary aspect of the present disclosure includes a battery assembly and sensors associated with the battery assembly. Each of the sensors is configured to provide a temperature reading from an area of the battery assembly. The assembly further includes a controller that is configured to assess whether each of the temperature readings is reliable or unreliable, and is further configured to detect a thermal event based at least in part on temperature readings that are reliable.

In another example of the foregoing assembly, the battery assembly includes an enclosure assembly surrounding at least one battery array.

In another example of the foregoing assembly, the sensors are thermistors.

In another example of the foregoing assembly, the controller is configured to selectively flag a given sensor within the sensors with an identifier indicating that the given sensor is unreliable. The flag is based on the temperature reading from the given sensor during a current drive cycle, and is based further on the temperature reading from the given sensor during a preceding drive cycle.

In another example of the foregoing assembly, the preceding drive cycle immediately preceded the current drive cycle such that there was no intervening drive cycle between the preceding drive cycle and the current drive cycle.

In another example of the foregoing assembly, the temperature reading from the given sensor during the current drive cycle is obtained at a start of the current drive cycle.

In another example of the foregoing assembly, the controller is configured to selectively flag a given sensor within the sensors with an identifier indicating that the given sensor is unreliable during a current drive cycle if the given sensor was flagged with an identifier during a preceding drive cycle indicating that the given sensor was potentially unreliable, but not if the given sensor was flagged with an identifier during the preceding drive cycle indicating that the sensor was reliable.

In another example of the foregoing assembly, the controller is further configured to keep a battery monitoring system awake for a set time based on at least one temperature reading from at least one of the sensors that are not flagged with the identifier indicating that the information from the sensor is unreliable.

In another example of the foregoing assembly, the controller is further configured to initiate a thermal event alert in response to both detecting a voltage drop associated with the battery assembly and detecting a temperature increase.

The controller detects the temperature increase based on at least one of the temperature readings from the sensors that are not flagged with the identifier indicating that information from the sensor is unreliable.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

BRIEF DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

This disclosure relates to thermal event detection for battery assemblies of electrified vehicles. An example electrified vehicle includes a battery assembly including an enclosure assembly surrounding at least one battery array, and a controller configured to receive information associated with the battery assembly. The controller can be used to detect a thermal event. The information used to detect the thermal event can be temperature-based information obtained from sensors, such as thermistors. This disclosure describes techniques utilized to identify sensors that have been compromised in some way, which can lead to inaccurate temperature readings. The information from the compromised sensors can be effectively ignored, which can facilitate more accurate detections of thermal events.

Figure 1:
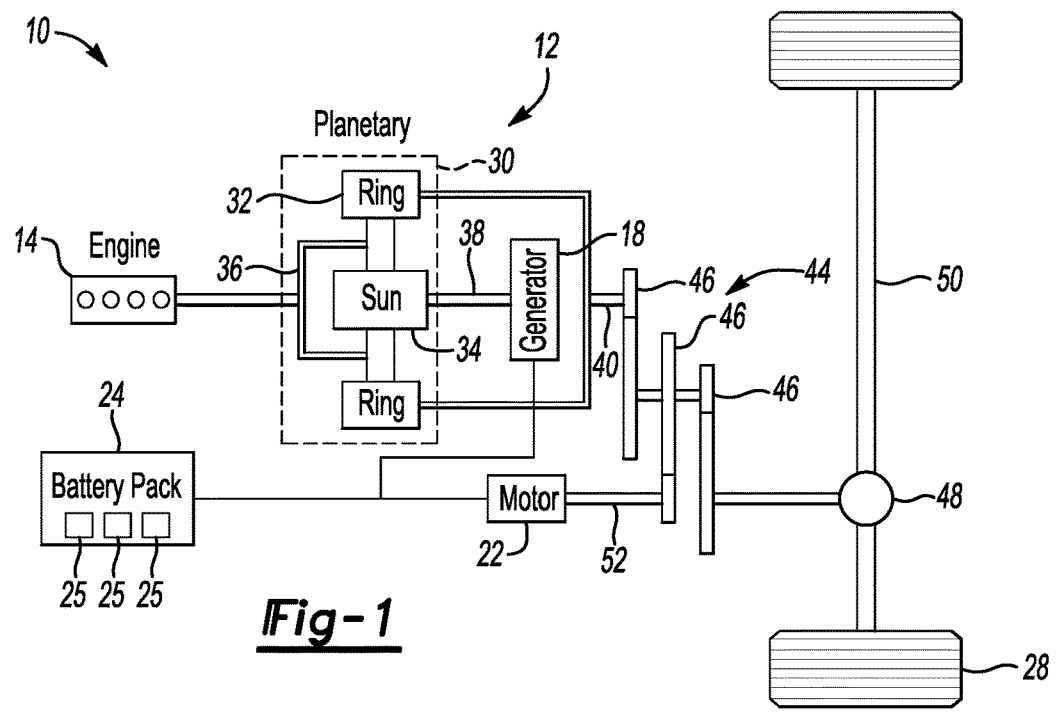
FIG. 1 schematically illustrates an example powertrain of an electrified vehicle.

FIG. 1 schematically illustrates a powertrain 10 for an electrified vehicle 12 ("vehicle 12"). Although depicted as a hybrid electric vehicle (HEV), it should be understood that the concepts described herein are not limited to HEVs and could extend to other electrified vehicles, including, but not limited to, plug-in hybrid electric vehicles (PHEVs) and battery electric vehicles (BEVs).

In one embodiment, the powertrain 10 is a power-split powertrain system that employs a first drive system and a second drive system. The first drive system includes a combination of an engine 14 and a generator 18 (i.e., a first electric machine). The second drive system includes at least a motor 22 (i.e., a second electric machine), the generator 18, and a battery pack 24. In this example, the second drive system is considered an electric drive system of the powertrain 10. The first and second drive systems generate torque to drive one or more sets of vehicle drive wheels 28 of the vehicle 12. Although a power-split configuration is shown, this disclosure extends to any hybrid or electric vehicle including full hybrids, parallel hybrids, series hybrids, mild hybrids or micro hybrids.

The engine 14, which in one embodiment is an internal combustion engine, and the generator 18 may be connected through a power transfer unit 30, such as a planetary gear set. Of course, other types of power transfer units, including other gear sets and transmissions, may be used to connect the engine 14 to the generator 18. In one non-limiting embodiment, the power transfer unit 30 is a planetary gear set that includes a ring gear 32, a sun gear 34, and a carrier assembly 36.

The generator 18 can be driven by the engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In one embodiment, the second power transfer unit 44 is mechanically coupled to an axle 50 through the differential 48 to distribute torque to the vehicle drive wheels 28.

The motor 22 can also be employed to drive the vehicle drive wheels 28 by outputting torque to a shaft 52 that is also connected to the second power transfer unit 44. In one embodiment, the motor 22 and the generator 18 cooperate as part of a regenerative braking system in which both the motor 22 and the generator 18 can be employed as motors to output torque. For example, the motor 22 and the generator 18 can each output electrical power to the battery pack 24.

The battery pack 24 is an exemplary electrified vehicle battery. The battery pack 24 may be a high voltage traction battery pack that includes one or more battery assemblies 25 (i.e., battery arrays or groupings of battery cells) capable of outputting electrical power to operate the motor 22, the generator 18, and/or other electrical loads of the vehicle 12.

Figure 2:
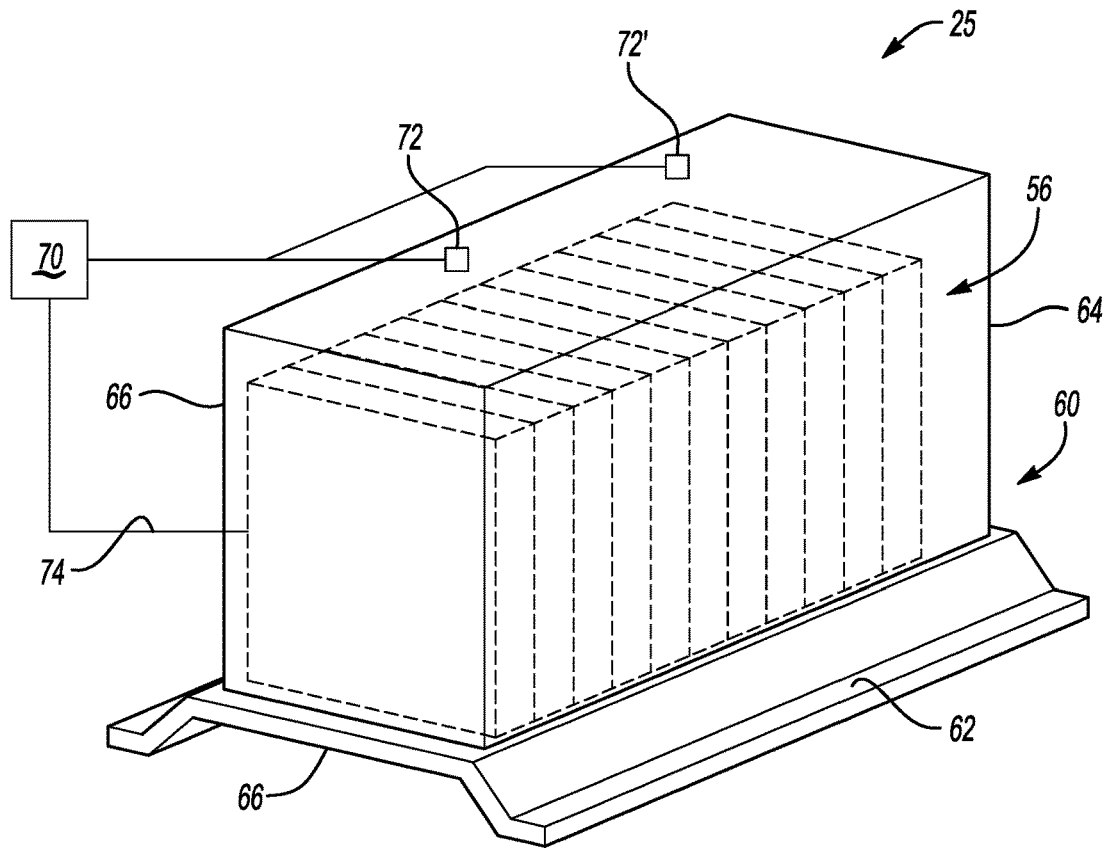
FIG. 2 schematically illustrates an exemplary battery assembly from the electrified vehicle of FIG. 1.

An example battery assembly 25 is shown in FIG. 2, and includes a single battery array with a plurality of battery cells. This disclosure is not limited to battery packs with one battery array and extends to battery packs with one or more battery arrays. Other types of energy storage devices and/or output devices can also be used to electrically power the vehicle 12.

In FIG. 2, the battery assembly 25 includes one battery array 56 configured to supply electrical power to various vehicle components. The battery array 56 includes a plurality of battery cells that may be stacked side by side along a span length (i.e., the largest dimension) of the battery array 56. Although, not shown in the schematic depiction of FIG. 2, battery cells are electrically connected to one another using bus bar assemblies. In one embodiment, the battery cells are prismatic, lithium ion cells. However, battery cells having other geometries (cylindrical, pouch, etc.) and/or other chemistries (nickel-metal hydride, lead-acid, etc.) could alternatively be utilized within the scope of this disclosure.

An enclosure assembly 60 surrounds the battery array 56. The enclosure assembly 60 is shown as a transparent structure in FIG. 2, but typically the enclosure assembly 60 is opaque.

In one non-limiting environment, the enclosure assembly 60 includes a tray 62 and a cover 64. The tray 62 and the cover 64 establish a plurality of walls 66 that surround an interior (i.e., area inside the walls 66) of the enclosure assembly 60, which houses the battery array 56 and other components of the battery assembly 25. The enclosure assembly 60 may take any size, shape, or configuration, and is not limited to the specific configuration of FIG. 2.

The battery cells and internal components of the battery assembly 25 can experience thermal runaway during certain battery thermal events (e.g. overcharging, overheating, etc.). Further, in some conditions, the battery cells may vent gases into the interior of the enclosure assembly 60.

Embodiments of this disclosure can monitor for conditions indicative of thermal events and can facilitate the taking of corrective actions in response to a detected thermal event. In so doing, the examples of this disclosure mitigate such events. Further, the exemplary embodiments of this disclosure provide increased user awareness of such events.

The exemplary vehicle 12 includes a controller 70 configured to receive information associated with the battery assembly 25 and to detect a thermal event based on the received information. The controller 70 is shown schematically in FIG. 2. The controller 70 is, in some examples, a Battery Management System (BMS) including a Battery Energy Control Module (BECM). In other examples, the controller 70 is a specific controller designed to carry out the exemplary methods of this disclosure.

It should be understood that the controller 70 may include hardware and software, and could be part of an overall vehicle controller module, such as a battery on-board control module, or vehicle system controller (VSC), or could alternatively be a standalone controller separate from VSC. In an example embodiment, some of the operations of the controller 70 described herein may be performed by separate control modules, such as the on-board control module, and vehicle control module. In this regard, the controller 70 may include one or more of an on-board control module and vehicle control module.

The controller 70 can be programmed with executable instructions for interfacing with and operating the various components of the vehicle 12. The controller 70 can include a processing unit and non-transitory memory for executing the various control strategies and modes of the vehicle system. In an example, the controller 70 includes, as memory, electrically erasable programmable read-only memory (EEPROM), which is a type of non-volatile memory often used in computers and remote keyless systems. EEPROMs can be programmed and erased in circuit by applying special programming signals, which may be sent by the controller 70.

The controller 70 is coupled to a plurality of sensors 72, 72' of the battery assembly 25, which are temperature sensors in the exemplary embodiment. In particular, the sensors 72, 72' in the exemplary embodiment are thermistors.

The sensors 72, 72' are arranged within the interior and are configured to provide a signal to the controller 70 that is indicative of a temperature in a particular area of the battery assembly 25. Thus, signals sent from the sensors 72, 72' to the controller 70 reveal temperatures in various areas of the battery assembly 25.

The controller 70 is additionally able to obtain voltage measurements from the battery assembly 25 along a path 74. The voltage measurements for signals reveal to the controller 70 the voltage at various areas of the battery assembly 25. The voltage may be provided to the controller 70 as representative of the voltage of a particular cell within the battery assembly 25.

Information associated with the battery assembly 25, other than temperature and voltage information, can also be provided to the controller 70.

The controller 70 can detect a thermal event, such as thermal runaway, using temperature and voltage information from the battery assembly 25. Detecting a high temperature within the battery assembly 25 accompanied by a voltage drop can indicated thermal runaway, for example.

Typically, areas of the controller 70 enter a sleep mode at the conclusion of a drive cycle or power cycle of the vehicle 12. However, if a high temperature from one or more of the sensors 72, 72' is detected, the controller 70 may stay awake at the end of a power cycle or drive cycle of the vehicle 12. While awake, the controller 70 can monitor for voltage drops or other factors that indicated a thermal event. The controller 70 may, for example, keep the BECM awake even if a key off of the vehicle 12 is requested because the controller 70 has received a particular temperature measurement. The temperature measurement could be a signal indicated a maximum temperature reading from one of the sensors 72, 72'.

From time to time, sensors 72, 72' malfunction or otherwise provide signals to the controller 70 that do not accurately reflect an actual temperature in the areas of the battery assembly 25 associated with that sensor 72, 72'. The sensors 72, 72' could short, for example. As can be appreciated, temperature data from a malfunctioning sensor can be inaccurate and unreliable. If the controller 70 is relying on data from the unreliable sensor, the controller 70 may take unnecessary actions, such as keeping the BECM away even if a key off of the vehicle 12 is requested.

Exemplary embodiments of this disclosure disclose strategies for detecting and identifying sensors 72, 72' (e.g., thermistors) that are faulty and unreliable. Information from the sensors 72, 72' that are not faulty can be flagged with a first identifier to indicate that the information is reliable. Information from the sensors 72, 72' that are faulty can be flagged with a second identifier to indicate that the information is unreliable. The identifiers can be stored and accessed by the controller 70. The controller 70 can then effectively ignore the information from the sensors 72, 72' flagged with the second identifier until those sensors 72, 72' have been repaired. Ignore, for purposes of this example, means that the controller 70 does not rely on information from those sensors 72, 72' when assessing whether or not a thermal event has occurred.

Figure 3:
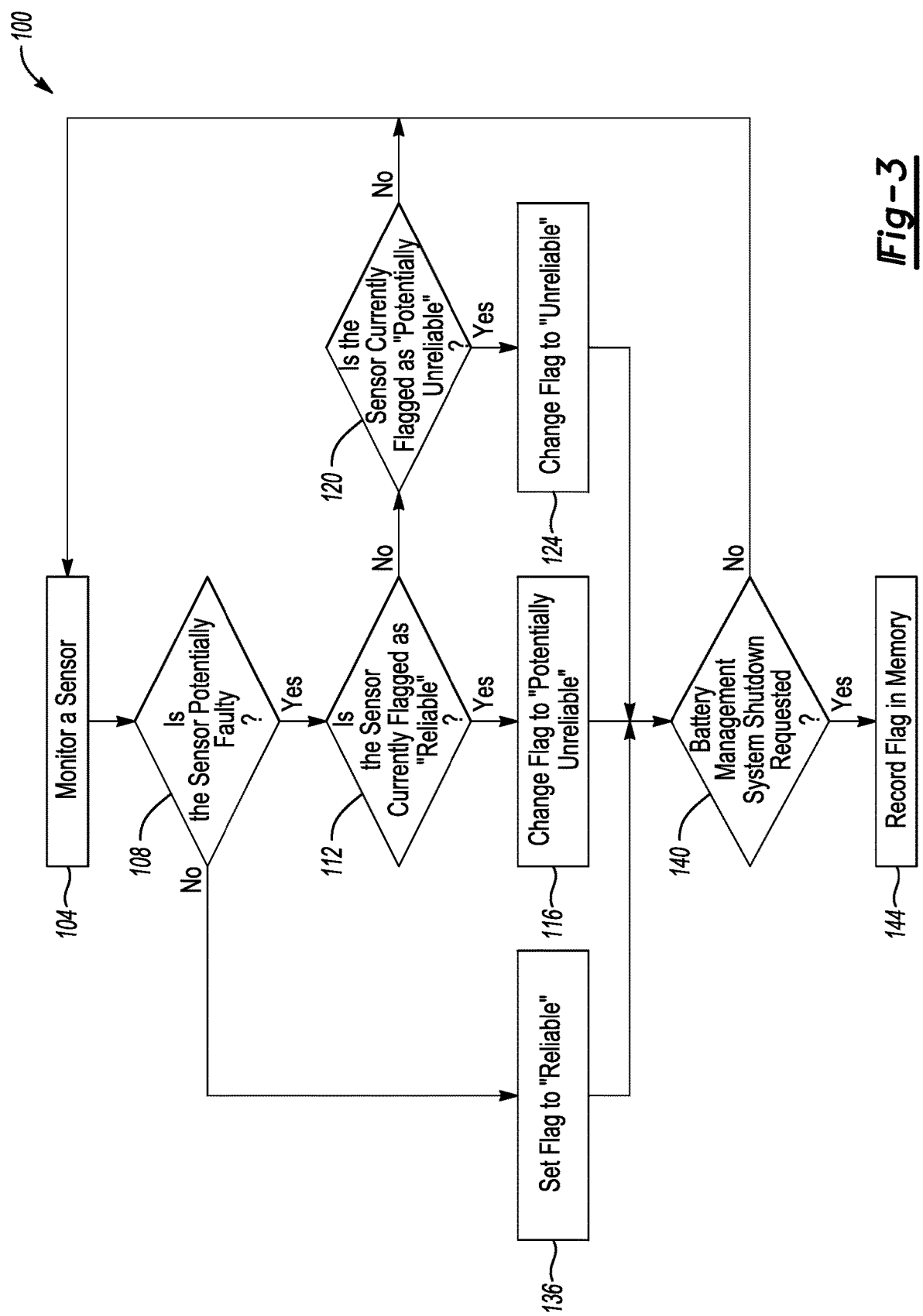
FIG. 3 illustrates a flow of an exemplary method of monitoring sensors associated with the battery assembly of FIG. 2.

With reference now to FIG. 3 and continued reference to FIG. 2, a flow of an example method 100 of flagging the sensor 72 within the battery assembly 25 begins at a step 104 where the sensor 72 of the battery assembly 25 is monitored. The sensor 72' can be similarly monitored along with the other temperature sensors of the battery assembly 25.

From the step 104, the method 100 moves to a step 108, which assesses whether or not the sensor 72 is potentially faulty. The assessment in the step 108 can involve comparing a temperature reading obtained from the sensor 72 to a threshold temperature value. If the temperature reading indicates that the temperature exceeds the threshold value, or is within a threshold value range, the method 100 may consider the sensor 72 to be potentially faulty.

As an example, a temperature reading from the sensor 72 indicating a temperature from 70° C. to 95° C. can be considered a severely high temperature reading which would ordinarily not occur within the battery pack 24. A temperature reading obtained from the sensor 72 indicating a temperature within this range can indicate that the sensor 72 is potentially faulty.

In the exemplary embodiment, the sensors 72, 72' within the battery pack 24 are continually flagged by the controller 70 with a first identifier, second identifier, or a third identifier. In this example, the first identifier indicates that the information from the sensor is reliable, the second identifier indicates that the information is unreliable, and the third identifier indicates that the information potentially unreliable. In the exemplary embodiment, the first flag is thus "RELIABLE," the second flag "UNRELIABLE," and the third flag "POTENTIALLY UNRELIABLE." The flag associated with each sensor 72, 72' can be stored within EEPROM of the controller 70.

If the temperature reading from the sensor 72 indicates that the sensor 72 is potentially faulty at the step 108, the method 100 moves from the step 108 to the step 112. At the step 112, the method 100 considers whether the sensor 72 is currently flagged as RELIABLE.

Thus, the step 112 can involve obtaining information about what flag is currently associated with the sensor 72. If the sensor 72 was flagged previously as RELIABLE, the method 100 moves to a step 116, which changes the flag associated with the sensor 72 to POTENTIALLY UNRELIABLE. If the sensor 72 at the step 112 was not flagged as RELIABLE, the method 100 moves from the step 112 to a step 120 which assesses whether or not the sensor 72 is currently flagged as POTENTIALLY UNRELIABLE. If not, the method 100 returns to the step 104.

If, at the step 120, the sensor 72 is currently flagged as POTENTIALLY UNRELIABLE the method 100 moves to a step 124, which changes the flag associated with the sensor 72 to UNRELIABLE.

Returning to the step 108, if the sensor 72 is not potentially faulty, which can mean that the temperature reading obtained from the sensor 72 is below a threshold temperature value or range, the method 100 moves from the step 108 to a step 136, which sets (or maintains) the flag associated with the sensor 72 to RELIABLE.

From the steps 136, 116, and 124, the method 100 moves to a step 140, which continually monitors to assess whether or not shutdown of the BMS has been requested. In an example, a user keying off the vehicle can prompt such a request.

If shutdown of the BMS has not been requested, the method 100 returns to the step 104. If shutdown of the BMS has been requested, the method 100 moves to the step 144, which records the flag changed at the step 136, 116, or 124.

Again, the BMS shutdown may be requested at the conclusion of a drive cycle as the vehicle is powered down. Thus, at the conclusion of a drive cycle, each of the sensors 72 within the battery assembly 25 is flagged as RELIABLE, POTENTIALLY UNRELIABLE, or UNRELIABLE.

For purposes of assessing a thermal event, temperature measurements from sensors flagged as RELIABLE or POTENTIALLY UNRELIABLE can be utilized. Information from sensors flagged as UNRELIABLE can have their measurements disregarded.

Temperature measurements from faulty and unreliable sensors, such as temperature sensors that have shorted out, can provide signals indicating a high temperature reading. Without the flagging method of this disclosure, the measurements may inaccurately reflect a thermal event. The exemplary method 100 ensures that measurements revealing higher temperatures are filtered somewhat to assess whether or not those measurements can be accurately relied on.

Figure 4:
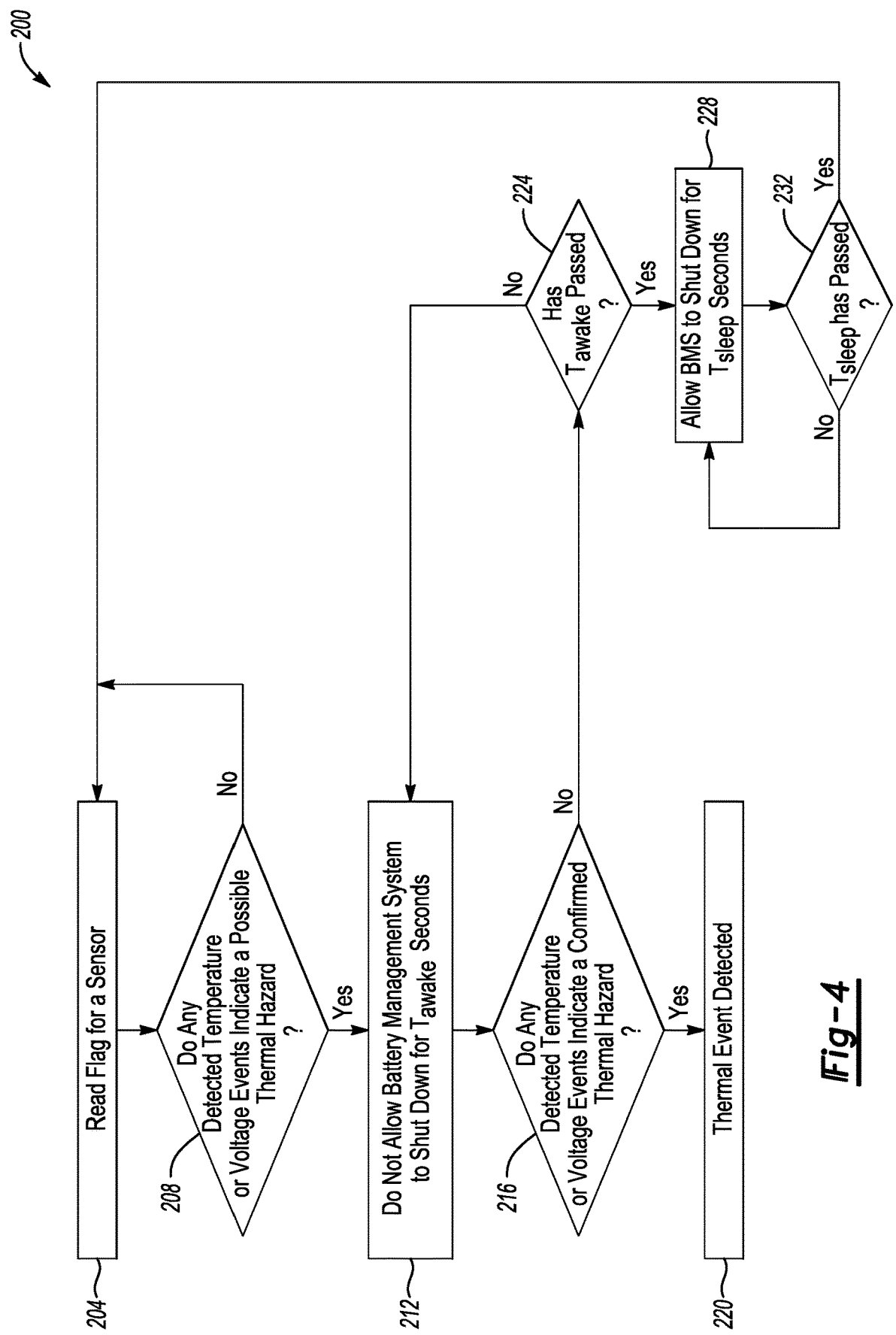
FIG. 4 illustrates a flow of an example thermal event detection method.

With reference now to FIG. 4, an example thermal event detection method 200 utilized in connection with the method of FIG. 3 and the assembly of FIG. 2 begins at a step 204 where a flag is associated with a particular sensor is read. Next, at a step 208, if a voltage event or a temperature event from a sensor that is not flagged as UNRELIABLE is detected, the method 200 moves to the step 212 and keeps the battery management system event as the detecting of the voltage event or temperature event can indicate a possible thermal hazard event. The detecting of the voltage event can be accomplished by comparing the voltage reading from the sensor to a threshold voltage. The detecting of the temperature event can be accomplished by comparing the temperature reading from the sensor to a threshold temperature.

Voltage events indicating a potentially undesirable thermal event can include, but are not limited to, a detected single/multiple battery cell voltage drop. A voltage reading fault can be cause by the monitoring chip or sense lead disconnection.

Temperature events indicating a potentially undesirable thermal event can include, but are not limited to, a confirmed high temperature reading from a sensor that is not flagged UNRELIABLE, or a confirmed high temperature rate of change detected from a sensor that is not flagged UNRELIABLE over a period of time.

In other words, the method 200, at the step 212, does not allow the battery management system to shut down for a threshold amount of time, here $T_{awake}$ seconds. The method 200 then moves from a step 212 to a step 216, which assesses whether a particular combination of temperature events and voltage events has occurred. The combination of a temperature reading above a threshold value from a sensor that is not UNRELIABLE along with a drop in voltage can indicate a thermal event. Accordingly, if yes at the step 216, the method moves to the step 220, which indicates that a thermal event has been detected.

In response to a detection of a thermal event at a step 220, the controller 70 may issue an alert, such as an audible alert to a user of the vehicle, or a text-based alert communicated to a technician. The user and technician can then take appropriate action to address the detection of the thermal event. The appropriate action can include repairing the battery assembly 25.

If, at the step 216, the temperature reading from the sensor does not exceed the threshold or if the voltage has not dropped or faulted, the method 200 does not detect a thermal event.

Instead, the method 200 moves to the step 224, which assesses whether or not the time $T_{awake}$ has passed. If not, the method 200 returns to the step 212. If the time $T_{awake}$ has passed at the step 224, the method 200 moves to the step 228, which allows the BMS to shut down for a threshold time here, $T_{sleep}$ seconds. At the step 232, the method 200 assesses whether the time $T_{sleep}$ has passed. If not, the method 200 returns to the step 228. If yes at the step 232, the method 200 moves from the step 232 back to the step 204.

Detecting a thermal event utilizing temperature and voltage measurements is known. Filtering potentially inaccurate temperature measurements from this information has been met with challenges. The embodiments of this disclosure describe exemplary approaches to assessing whether or not the temperature method is reliable such that it can indicate a potential thermal event, or whether information from a particular sensor is unreliable. In such a case, the unreliable sensor can then be repaired or disregarded.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

What is claimed is:

1. A method of detecting a thermal event associated with a battery assembly of an electrified vehicle, comprising:
   obtaining a temperature reading from a sensor associated with an area of the battery assembly;
   assessing whether the sensor is flagged with a first identifier or a second identifier, the first identifier indicating that the temperature reading is reliable, the second identifier indicating that the temperature reading is unreliable; and
   if the sensor is flagged with the first identifier, detecting a thermal event associated with the battery assembly based on the temperature reading from the sensor,
   wherein the temperature reading is a current temperature reading, and further comprising flagging the sensor with the second identifier based on the current temperature reading during a current drive cycle, and based further on a past temperature reading from the sensor during a preceding drive cycle.

2. The method of claim 1, if the sensor is flagged with the second identifier, detecting a thermal event associated with the battery assembly without relying on the temperature reading from the sensor.

3. The method of claim 1, wherein the preceding drive cycle immediately preceded the current drive cycle such that there was no intervening drive cycle between the preceding drive cycle and the current drive cycle.

4. The method of claim 1, wherein the current temperature reading from the sensor is obtained at a start of the current drive cycle, wherein the past temperature reading from the sensor is obtained at a start of the preceding drive cycle.

5. The method of claim 1, further comprising,
   during the preceding drive cycle, flagging the sensor with the first identifier or a third identifier, the third identifier indicating that the sensor is potentially unreliable, and,
   during the current drive cycle, flagging the sensor with the second identifier based at least in part on the sensor being flagged with the third identifier during the preceding drive cycle.

6. The method of claim 5, wherein the sensor is flagged with the second identifier during the current drive cycle if the sensor was flagged with the third identifier during the preceding drive cycle, but not if the sensor was flagged with the first identifier during the preceding drive cycle.

7. The method of claim 1, wherein the sensor is a thermistor.

8. The method of claim 1, further comprising keeping a battery monitoring system awake for a set time based on at least one temperature reading from the sensor that are not flagged with the second identifier indicating that the information from the sensor is unreliable.

9. The method of claim 8, further comprising initiating a thermal event alert in response to detecting a voltage drop associated with the battery assembly and detecting a temperature increase using the temperature reading from the sensor when the sensor is not flagged as unreliable.

10. The method of claim 8, further comprising shutting down the battery monitoring system after expiration of the set time.

11. An electrified vehicle assembly, comprising:
    a battery assembly;
    a plurality of sensors associated with the battery assembly, each of the sensors within the plurality of sensors configured to provide a temperature reading from an area of the battery assembly; and
    a controller configured to assess whether each of the temperature readings is reliable or unreliable, and further configured to detect a thermal event based at least in part on temperature readings that are reliable,
    wherein the controller is configured to selectively flag a given sensor within the plurality of sensors with an identifier indicating that the given sensor is unreliable, the flag based on the temperature reading from the given sensor during a current drive cycle, and based further on the temperature reading from the given sensor during a preceding drive cycle.

12. The electrified vehicle of claim 11, wherein the battery assembly includes an enclosure assembly surrounding at least one battery array.

13. The electrified vehicle of claim 11, wherein the sensors are thermistors.

14. The electrified vehicle of claim 11, wherein the preceding drive cycle immediately preceded the current drive cycle such that there was no intervening drive cycle between the preceding drive cycle and the current drive cycle.

15. The electrified vehicle of claim 11, wherein the temperature reading from the given sensor during the current drive cycle is obtained at a start of the current drive cycle.

16. The electrified vehicle of claim 11, wherein the controller is configured to selectively flag a given sensor within the plurality of sensors with an identifier indicating that the given sensor is unreliable during a current drive cycle if the given sensor was flagged with an identifier during a preceding drive cycle indicating that the given sensor was potentially unreliable, but not if the given sensor was flagged with an identifier during the preceding drive cycle indicating that the sensor was reliable.

17. The electrified vehicle of claim 11, wherein the controller is further configured to keep a battery monitoring system awake for a set time based on at least one temperature reading from at least one of the sensors that are not flagged with the identifier indicating that the information from the sensor is unreliable.

18. The electrified vehicle of claim 11, wherein the controller is further configured to initiate a thermal event alert in response to both detecting a voltage drop associated with the battery assembly and detecting a temperature increase, the controller detecting the temperature increase based on at least one of the temperature readings from the sensors that are not flagged with the identifier indicating that information from the sensor is unreliable.

* * * * *